United States Patent [19]

Nagase et al.

[11] Patent Number: 5,945,222
[45] Date of Patent: Aug. 31, 1999

[54] THERMOSETTING RESIN COMPOSITION, CURED PRODUCT, PREPREG, METAL-CLAD LAMINATE AND WIRING BOARD

[75] Inventors: Hideo Nagase, Oyama; Teruki Aizawa, Utsunomiya; Yasuyuki Hirai; Yoshihiko Sato, both of Oyama, all of Japan

[73] Assignee: Hitachi Chemical Company, Ltd., Tokyo, Japan

[21] Appl. No.: 08/791,813

[22] Filed: Jan. 30, 1997

[30] Foreign Application Priority Data

Feb. 9, 1996 [JP] Japan ..................................... 8-024292
Jun. 27, 1996 [JP] Japan ..................................... 8-167785

[51] Int. Cl.⁶ ............................... B32B 15/08; B32B 3/00
[52] U.S. Cl. .......................... 428/416; 428/418; 428/209; 428/901; 174/258
[58] Field of Search .................................... 428/209, 901, 428/416, 418; 174/258

[56] References Cited

U.S. PATENT DOCUMENTS 4,557,979  12/1985  Higginbottom et al. ............... 428/460

FOREIGN PATENT DOCUMENTS 0659832  6/1995  European Pat. Off. .
95211857  8/1995  Japan .
96183855  7/1996  Japan .
96231734  9/1996  Japan .
9720816   1/1997  Japan .
9070844   3/1997  Japan .
97157496  6/1997  Japan .
8183855   7/1997  Japan .

OTHER PUBLICATIONS

Chemical Patents Index, Documentation Abstracts Journal, Section Ch, Week 9638 Oct. 25, 1996, Derwent Publication Ltd., London, GB; Class A26, AN 96–379336.

Chemical Patents Index, Documentation Abstract Journal, Section Ch, Week 9726 Jul. 25, 1997, Derwent Publications Ltd., London, GB; Class A23, AN 97–283915.

*Primary Examiner*—Deborah Jones
*Assistant Examiner*—Cathy F. Lam
*Attorney, Agent, or Firm*—Antonelli, Terry, Stout & Kraus, LLP

[57] ABSTRACT

A thermosetting resin composition (a) comprising 60 to 97% by weight of a thermosetting resin containing dihydrobenzoxazine rings and 3 to 40% by weight of a novolac phenolic resin and a thermosetting resin composition (b) comprising 5 to 30% by weight of the thermosetting resin and 70 to 95% by weight of a novolac phenolic resin are cured fast, and the cured products thereof are excellent in mechanical properties and non-flammability.

20 Claims, No Drawings

THERMOSETTING RESIN COMPOSITION, CURED PRODUCT, PREPREG, METAL-CLAD LAMINATE AND WIRING BOARD

BACKGROUND OF THE INVENTION

(a) Field of the Invention

The present invention relates to thermosetting resin compositions which are excellent in heat resistance and non-flammability and useful as materials of high functional molding materials, paint, coating materials, adhesives, sealing materials, prepreg for printed wiring boards, metal-clad laminates, FRP and carbon goods. The present invention further relates to cured products of the thermosetting resin compositions and prepreg, metal-clad laminates and wiring boards which are produced by using the thermosetting resin compositions.

(b) Description of the Related Art

Thermosetting resins, such as phenolic resins, melamine resins, epoxy resins, unsaturated polyester resins and bismaleimide resins, have been used in various industrial fields because of reliability and heat resistance due to the thermosetting properties thereof. These resins however have individual disadvantages that, for example, phenolic resins and melamine resins generate volatile by-products on curing, epoxy resins and unsaturated polyester resins have poor heat resistance and bismaleimide resins are very expensive, and these disadvantages should be put up with according to the usage. So there have been developed new thermosetting resins free from such disadvantages.

An example is the development of dihydrobenzoxazine compounds (Japan Patent Application Unexamined Publication No. 49-47387 and the specification of U.S. Pat. No. 5,152,939). Since the compounds are cured with heat by the ring opening polymerization of dihydrobenzoxazine rings, volatile matters are hardly generated during curing.

Researches in the curing and reactivity of the compounds have been reported by Burke et al. in J. Am. Chem. Soc. 3424(1956) and by Riess et al. in Polym. Sci. Technol. 27(1985). Japan Patent Application Unexamined Publication No. 7-188364 discloses dihydrobenzoxazine compounds which are improved in curability by leaving a specific percentage of phenolic hydroxyl groups uncyclized.

The dihydrobenzoxazine compounds disclosed in Japan Patent Application Unexamined Publication No. 49-47387 are cured by ring opening polymerization to give cured resins which are superior to the cured products of conventional thermosetting resins in heat resistance and strength. The curing by ring opening polymerization, however, is time consuming as compared with the conventional curing of phenolic resins, and has limited usage due to the low productivity.

As disclosed in Japan Patent Application Unexamined Publication No. 7-188364, dihydrobenzoxazine compounds containing in molecules a specific percentage of phenolic hydroxyl groups left without converting to dihydrobenzoxazine rings are improved in curability, but are difficult to synthesize steadily since ring opening polymerization proceeds by the heating during the synthesis of the compounds.

Although Burke et al. and Riess et al. reported improvement of curability by the addition of monofunctional phenolic compounds, the improvement is insufficient, and a decrease in heat resistance and mechanical strength is caused by a lowered crosslinking density.

SUMMARY OF THE INVENTION

An object of the present invention is to provide compositions which contain thermosetting resins containing dihydrobenzoxazine rings and are improved in curability without deteriorating other properties, such as mechanical properties.

Another object of the present invention is to provide cured products of the thermosetting resin compositions, and to provide prepreg, metal-clad laminates and wiring boards which are produced by using the thermosetting resin compositions.

As a result of studies for attaining the objects, we have found that curability of the thermosetting resins containing dihydrobenzoxazine rings can be improved by adding novolac phenolic resins as curing agents, without other properties including mechanical properties deteriorated. We have also found that the addition of the thermosetting resins containing dihydrobenzoxazine rings as curing agents to novolac phenolic resins provides thermosetting resin compositions which are cured, generating little volatile matters, and are excellent in various properties including mechanical properties. On the basis of these findings, we have completed the present invention.

That is, the present invention provides thermosetting resin compositions [thermosetting resin compositions (a)] comprising 60 to 97% by weight of thermosetting resins containing dihydrobenzoxazine rings and 3 to 40% by weight of novolac phenolic resins.

The present invention further provides thermosetting resin compositions [thermosetting resin compositions (b)] comprising 5 to 30% by weight of thermosetting resins containing dihydrobenzoxazine rings and 70 to 95% by weight of novolac phenolic resins.

The present invention further provides cured products of the thermosetting resin compositions (a) and (b).

The present invention further provides prepreg produced by impregnating base materials with varnish containing the thermosetting resin compositions (a) or (b), followed by drying with heat.

The present invention further provides metal-clad laminates comprising a laminate produced by bonding two or more sheets of the prepreg together using heat and pressure, and metal foil bonded to one or both surfaces of the laminate.

The present invention further provides wiring boards comprising an insulating base and conductor patterns formed inside or on one or both surfaces of the insulating base, the insulating base comprising a matrix of the cured products of the thermosetting resin compositions (a) or (b) and base materials reinforcing the matrix.

DESCRIPTION OF THE PREFERRED EMBODIMENTS

The thermosetting resins containing dihydrobenzoxazine rings which may be used in the present invention are not limited so far as they have dihydrobenzoxazine rings and are cured by the ring opening polymerization of the dihydrobenzoxazine rings. The thermosetting resins containing dihydrobenzoxazine rings are synthesized, for example, from compounds containing phenolic hydroxyl groups, primary amines and formaldehyde, as shown by the following formula.

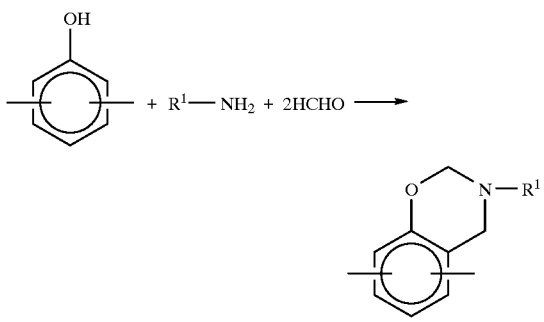

wherein, $R^1$ is methyl, phenyl or a phenyl substituted by at least one alkyl or alkoxy of 1 to 3 carbon atoms, and the phenylene in the above formula has a hydrogen atom at one or both ortho-positions to the hydroxyl group thereof.

Non-limitative examples of the compounds containing phenolic hydroxyl groups are polyfunctional phenols, biphenol, bisphenol compounds, trisphenol compounds, tetraphenol compounds and phenolic resins. Non-limitative examples of the polyfunctional phenols are catechol, hydroquinone and resorcinol. Non-limitative examples of the bisphenol compounds are bisphenol A, bisphenol F and position isomers thereof, bisphenol S and tetrafuruorobisphenol A. Non-limitative examples of the phenolic resins are phenol novolac resins, resol resins, phenol-modified xylene resins, alkylphenol resins, melamine phenol resins and phenol-modified polybutadiene.

Non-limitative examples of the primary amines are methylamine, aniline and substituted anilines, such as toluidine and anisidine. Thermosetting resins synthesized by using aliphatic amines are cured fast, but are less heat resistant. Thermosetting resins synthesized by using aromatic amines, such as aniline, give cured products having excellent heat resistance, but are cured relatively slowly.

The thermosetting resins containing dihydrobenzoxazine rings are obtainable by adding a mixture of compounds which have at least two hydroxyphenylene groups each containing hydrogen at one or both ortho-positions to a hydroxyl group thereof and, hereinafter, will be referred to as compounds containing reactive hydroxyphenylene groups, and primary amines to formaldehyde, such as formalin, heated to 70° C. or higher, allowing the mixture to react for 20 minutes to 2 hours at 70 to 110° C., preferably 90 to 100° C., and then drying at 120° C. or lower under reduced pressure.

For the above-described reaction, 0.5 to 1.0 moles, preferably 0.6 to 1.0 moles of the primary amines per mole of all phenolic hydroxyl groups of the compounds containing reactive hydroxyphenylene groups, and at least two moles of formaldehyde per mole of the primary amines are used. If the primary amines are less than 0.5 moles, crosslinking density may be decreased, and the heat resistance may be insufficient.

In the present invention, the thermosetting resins containing dihydrobenzoxazine rings may be used individually or in combination of two or more. Before the preparation of the thermosetting resin compositions of the present invention, the thermosetting resins may be prepolymerized by heating at 80 to 180° C., preferably 120 to 160° C., to control cure time and melt viscosity.

Non-limitative examples of the novolac phenolic resins to be used in the present invention for mixing with the thermosetting resins are phenol novolac resins, bisphenol novolac resins, phenol-modified xylene resins and alkylphenol resins.

In the present invention, it is preferable to use so-called high ortho novolac resins, which are novolac phenolic resins containing an ortho rate of at least 50%. Such high ortho novolac resins improve curability without deteriorating mechanical properties.

The thermosetting resin compositions (a) of the present invention comprise 60 to 97% by weight, preferably 70 to 95% by weight of the thermosetting resins containing dihydrobenzoxazine rings and 3 to 40% by weight, preferably 5 to 30% by weight of the novolac phenolic resins. Thermosetting resins containing dihydrobenzoxazine rings are self-curable, but generally require a long cure time. The thermosetting resin compositions (a) of the present invention are improved in curability by the addition of 3 to 40% by weight of the novolac phenolic resins, while maintaining good mechanical properties. If the thermosetting resins containing dihydrobenzoxazine rings are more than 97% by weight, the improvement in curability may be insufficient.

The cured products of resins containing dihydrobenzoxazine rings are also characterized by their lower water absorption as compared with the cured products of conventional thermosetting resins comprising epoxy resins and phenolic resins. This seems to attribute to the fixation of phenolic hydroxyl groups due to their interaction with nitrogen atoms. To maintain such a characteristic, the thermosetting resin compositions (a) of the present invention are desirable since the compositions (a) contain the thermosetting resins containing dihydrobenzoxazine rings as the main component, and it is also preferable that phenolic hydroxyl groups in the thermosetting resin compositions and nitrogen atoms contained in the dihydrobenzoxazine rings are present in a number ratio of the phenolic hydroxyl groups/the nitrogen atoms of not more than 1.5, more preferably 0.3 to 1.5, particularly preferably 0.5 to 1.10.

The thermosetting resin compositions (b) of the present invention comprise 5 to 30% by weight, preferably 15 to 30% by weight of the thermosetting resins containing dihydrobenzoxazine rings and 70 to 95% by weight, preferably 70 to 85% by weight of novolac phenolic resins. In the compositions (b) containing 70 to 95% by weight of the novolac phenolic resins, the thermosetting resins containing dihydrobenzoxazine rings work as curing agents. Because of the absence of hexamethylenetetramine which is a conventional curing agent for novolac resins, the thermosetting resin compositions (b) are cured without generating volatile matters, such as ammonia, thereby improving work efficiency. The cured products are also improved in mechanical strength.

If the novolac phenolic resins are more than 40% by weight or less than 70% by weight, curability may be improved, but the mechanical properties of the cured products may be lowered.

When faster curing is required, the thermosetting resin compositions (a) and (b) of the present invention may further contain a small amount of conventional curing agents for phenolic resins, such as hexamethylenetetramine. Even if such conventional curing agents are used additionally, the amount thereof can be decreased to minimize the generation of volatile matters, such as ammonia. In cases where such conventional curing agents are added to either the thermosetting resin compositions (a) or (b), the preferred amount is 1 to 5% by weight based on the total of the thermosetting resins containing dihydrobenzoxazine rings and the novolac phenolic resins.

The thermosetting resin compositions of the present invention may be prepared by grinding the thermosetting resins containing dihydrobenzoxazine rings and the novolac phenolic resins, and then powder mixing, or, preferably, melt mixing with heating rolls or solution mixing in solvents.

The compositions of the present invention may further contain additives, for example, reinforcing materials, such as fillers and reinforcing fibers, release agents, colorants and adhesives, according to demands.

Non-limitative examples of the fillers are organic fillers, such as cotton flocks, α-cellulose, pulp and wood powder, and inorganic fillers, such as zircon powder, quartz glass powder, talc powder, calcium carbonate powder, magnesium hydroxide powder, magnesia powder, calcium silicate powder, silica powder, zeolite, clay and mica.

Non-limitative examples of the reinforcing fibers are staple fiber, yarn, cotton cloth, glass cloth, non-woven glass cloth, glass fiber, carbon fiber, quartz fiber, organic fiber, organic fiber cloth, non-woven organic fiber cloth and paper.

The amount of the reinforcing materials is preferably 10 to 300 parts by weight per 100 parts by weight of the thermosetting resin compositions of the present invention.

The thermosetting resin compositions of the present invention are superior in curability to thermosetting resins containing dihydrobenzoxazine rings, so that curing can be performed by kneading with heating rolls or the like, and then pressure forming or transfer forming at 180 to 220° C. at a molding pressure of 20 to 70 kgf/cm$^2$ for 15 to 30 minutes, to give cured products which are excellent in mechanical properties and non-flammability.

The properties of the cured products can be further improved by carrying out after-curing at 180 to 220° C. for 5 to 120 minutes.

The thermosetting resin compositions (a) and (b) of the present invention may further contain epoxy resins and curing agents therefor according to the usage, for example, for the production of metal-clad laminates, molding materials, sealing materials and FRP resin materials.

The epoxy resins which may be used as the above-described additive component are not limited, and non-limitative examples are epoxidation products of novolac resins derived from phenols and aldehydes, such as phenol novolac epoxy resins and ortho-cresol novolac epoxy resins; glycidyl ether epoxy resins obtainable by the reaction of polyols, such as bisphenol A, bisphenol B, bisphenol F and bisphenol S, with epichlorohydrin; glycidyl ester epoxy resins obtainable by the reaction of polyacids, such as phthalic acids, with epichlorohydrin; glycidyl amine epoxy resins obtainable by the reaction of polyamines, such as diaminodiphenylmethane and isocyanuric acid, with epichlorohydrin; linear aliphatic epoxy resins and alicyclic epoxy resins obtainable by oxidizing olefin bonds with per acids, such as peracetic acid; and brominated epoxy resins, and these epoxy resins may be used individually or in combination of two or more. The curing agents for the epoxy resins are not limited, and preferred examples are curing agents generating no volatile matters during curing, and polyaddition type curing agents, such as novolac phenolic resins, dicyandiamide, imidazoles and triphenylphosphine, are particularly suitable. In cases where novolac phenolic resins are used as curing agents, the novolac phenolic resins are added, in addition to the novolac phenolic resins used as one of the essential components of the thermosetting resin compositions (a) and (b), preferably, in a molar ratio of the hydroxyl groups of the novolac phenolic resins/the epoxy groups of the epoxy resins is 0.5 to 1.5.

The thermosetting resin compositions of the present invention (thermosetting resin compositions (a) and (b)) are suitably used as the resin materials of high functional molding materials which are excellent in heat resistance, non-flammability and molding efficiency, paint, coating materials, adhesives, sealing materials, prepreg for printed wiring boards, metal-clad laminates, FRP, carbon goods or the like.

For example, the thermosetting resin compositions of the present invention alone or, according to demands, together with additives, such as fillers, reinforcing fibers, release agents and colorants, may be used as various molding materials and sealing materials for the encapsulation of semiconductor devices.

The prepreg of the present invention is produced by impregnating base materials with varnish containing the thermosetting resin compositions of the present invention, and then drying with heat. The varnish may contain additives, such as fillers.

Non-limitative examples of the base materials are glass cloth, non-woven glass cloth, organic fiber cloth, non-woven organic fiber cloth and paper.

The metal-clad laminates of the present invention comprise a laminate produced by bonding two or more sheets of the prepreg together using heat and pressure, and metal foil bonded to one or both surfaces of the laminate. For example, the metal-clad laminates may be produced by put two or more sheets of the prepreg in layers with metal foil put on one or both sides of the layered prepreg, and then bonding the layered prepreg and the metal foil together using heat and pressure. Non-limitative examples of the metal foil are copper foil, nickel foil, aluminum foil and SUS foil.

The wiring boards of the present invention comprise an insulating base and conductor patterns formed inside or on one or both surfaces of the insulating base, and the insulating base comprises a matrix of cured products of the thermosetting resin compositions of the present invention and base materials reinforcing the matrix. Non-limitative examples of the base materials are glass cloth, non-woven glass cloth, organic fiber cloth, non-woven organic fiber cloth and paper. The insulating base may contain other additives, such as fillers.

The wiring boards of the present invention include printed wiring boards having conductor patterns on one or both surfaces of the insulating base and multilayer printed wiring boards having conductor patterns inside and on one or both sides of the insulating base. The printed wiring boards may be produced by patterning the metal foil of the metal-clad laminates of the present invention to form conductor patterns, and then, according to demands, connecting the conductor patterns by through holes. The multilayer printed wiring boards may be produced, for example, by a mass laminating method or a pin laminating method using the prepreg, metal-clad laminates and printed wiring boards of the present invention.

The wiring boards of the present invention are excellent in heat resistance and non-flammability, and are useful in various electric and electronic fields.

EXAMPLES 1 TO 13 AND COMPARATIVE EXAMPLES 1 TO 10

[1] Synthesis (I) of a thermosetting resin containing dihydrobenzoxazine rings (1) Synthesis of a phenol novolac resin 1.9 kg of phenol, 1.15 kg of formalin (37% aqueous solution) and 4 g of oxalic acid were placed in a 5-liter flask, and were then allowed to react by heating under reflux for 6 hours. Unreacted phenol and water were then removed under a vacuum of 6666.1 Pa or less. The obtained resin had a softening point of 89° C. (ring and ball method) and a ratio of tri- or higher polymers/dimers of 89/11 (peak area ratios determined by gel permeation chromatography).

(2) Introduction of dihydrobenzoxazine rings 1.7 kg (16 moles of hydroxyl groups) of the phenol novolac resin synthesized as above was mixed with 1.49 kg (16 moles) of aniline, and the mixture was then stirred at 80° C. for 5 hours to form a uniform solution mixture. In a 5-liter flask was placed 1.62 kg of formalin and was heated to 90° C., and the novolac/aniline solution mixture was then added thereto gradually over a 30 minutes interval. After the addition, reflux was continued for 30 minutes, and the condensed water was then removed by heating at 100° C. for two hours under a vacuum of 6666.1 Pa or less, to obtain a thermosetting resin (I) wherein 95% of reactive hydroxyl groups had been converted into dihydrobenzoxazine rings.

[2] Synthesis (II) of a thermosetting resin containing dihydrobenzoxazine rings (1) Synthesis of a phenol novolac resin 1.9 kg of phenol, 1.10 kg of formalin (37% aqueous solution) and 4 g of oxalic acid were placed in a 5-liter flask, and the procedure of the synthesis (I)-(1) was repeated to synthesize a phenol novolac resin. The obtained resin had a softening point of 84° C. (ring and ball method) and a ratio of tri- or higher polymers/dimers of 82/18 (peak area ratios determined by gel permeation chromatography).

(2) Introduction of dihydrobenzoxazine rings

Introduction of dihydrobenzoxazine rings to the phenol novolac resin obtained in synthesis (II)-(1 ) was conducted in a similar manner to synthesis (I)-(2). In the obtained thermosetting resin (II), 90% of reactive hydroxyl groups of the phenol novolac resin had been converted to dihydrobenzoxazine rings.

[3] Synthesis (III) of a thermosetting resin containing dihydrobenzoxazine rings The procedure of synthesis (I)-(2) was repeated with the exception that 0.76 kg (10 moles of hydroxyl groups) of bisphenol A, 0.93 kg (10 moles) of aniline and 1.62 kg of formalin (37% aqueous solution) were used as the starting materials, to obtain a thermosetting resin (III) wherein 94% of reactive hydroxyl groups had been converted to dihydrobenzoxazine rings.

[4] Synthesis (A) of a novolac phenolic resin 2.4 kg of phenol, 0.02 kg of formalin (37% aqueous solution), 0.6 kg of paraformaldehyde, 0.02 kg of zinc acetate, 0.06 kg of benzoic acid and 0.05 kg of water were placed in a 5-liter flask, and were then allowed to react for 6 hours under reflux. Unreacted phenol and water were then removed under a vacuum of 6666.1 Pa or less. The obtained resin (A) had a softening point of 75–83° C. (ring and ball method) and an ortho rate of 70% (NMR).

[5] Synthesis (B) of a novolac phenolic resin 1.9 kg of phenol, 1.3 kg of formalin (37% aqueous solution) and 15 g of oxalic acid were placed in a 5-liter flask, and were then allowed to react for 6 hours under reflux. Unreacted phenol and water were then removed under a vacuum of 6666.1 Pa or less. The obtained resin (B) had a softening point of 84° C. (ring and ball method) and an ortho rate of 40% (NMR).

[6] Preparation of resin compositions

In each of Examples 1 to 13 and Comparative Examples 6 and 8 to 10, a resin composition was prepared by placing the novolac phenolic resin as listed in Table 1, 2, 3 or 4 in a flask, melting the resin by heating at 110 to 120° C., adding the thermosetting resin containing dihydrobenzoxazine rings as listed in Table 1, 2, 3 or 4, and mixing the mixture for 5 minutes to obtain a uniform mixture. In each of Comparative Examples 1 to 3, only the thermosetting resin as listed in table 3 was used. In each of Comparative Examples 4 and 5, a resin composition was prepared by grinding the novolac phenolic resin as listed in Table 3 and hexamethylenetetramine, and mixing them in a mixer for three minutes. In Comparative Example 7, the thermosetting resin as listed in Table 4 was dissolved in molten phenol, and stirring for 5 minutes to obtain a uniform mixture.

[7] Curing

The resin compositions obtained above were ground, filled in a mold of internal sizes of 120×80×4 mm, and heating for 15 minutes at 180° C. under a pressure of 1.96 MPa, to give cured products.

The properties of the resin compositions were examined as follows.

Gel time is the time required for 0.3 g of each resin composition being agitated once per second on a gel timer heated to 180° C. to cease threading.

The measurements of flexural strength and flexural modulus were performed in accordance with JIS K 6911 at 23° C. at a bending rate of 2 mm/min.

The evaluation of non-flammability was performed in accordance with UL-94 using a sample of 3.6 mm thick.

Water absorption was calculated from the difference between the weights of a resin plate of 50×50×3 mm, which was molded in the same manner as described above, before and after a treatment in a PCT (pressure cooker tester: 121° C., 2 atm) for 10 hours. In Example 4 (phenolic OH/N=1.10) and Comparative Example 6 (phenolic OH/N=1.93), the value of the water absorption were 1.6% and 3.2%, respectively, showing a great difference.

The compositions and the properties of the resin compositions of Examples and Comparative Examples are listed in Tables 1 to 10. The units of the compositions are part by weight.

TABLE 1

|  |  | Example Nos. | | | | | | |
| --- | --- | --- | --- | --- | --- | --- | --- | --- |
|  |  | 1 | 2 | 3 | 4 | 5 | 6 | 7 |
| Thermosetting resin | (I) | 5 | 10 | 30 | 70 | 97 | 10 | 70 |
| containing | (II) | — | — | — | — | — | — | — |
| dihydrobenzoxazine rings | (III) | — | — | — | — | — | — | — |
| Novolac phenolic resin A |  | 95 | 90 | 70 | 30 | 3 | — | — |
| Novolac phenolic resin B |  | — | — | — | — | — | 90 | 30 |

TABLE 2

|  |  | Example Nos. | | | | | |
| --- | --- | --- | --- | --- | --- | --- | --- |
|  |  | 8 | 9 | 10 | 11 | 12 | 13 |
| Thermosetting resin | (I) | — | — | — | — | — | — |
| containing | (II) | 10 | 70 | 70 | — | — | — |
| dihydrobenzoxazine rings | (III) | — | — | — | 10 | 70 | 70 |
| Novolac phenolic resin A |  | 90 | 30 | — | 90 | 30 | — |
| Novolac phenolic resin B |  | — | — | 30 | — | — | 30 |

TABLE 3

|  |  | Comparative Example Nos. | | | | |
| --- | --- | --- | --- | --- | --- | --- |
|  |  | 1 | 2 | 3 | 4 | 5 |
| Thermosetting resin | (I) | 100 | — | — | — | — |
| containing | (II) | — | 100 | — | — | — |
| dihydrobenzoxazine rings | (III) | — | — | 100 | — | — |
| Novolac phenolic resin A |  | — | — | — | 85 | — |
| Novolac phenolic resin B |  | — | — | — | — | 85 |
| Hexamethylenetetramine |  | — | — | — | 15 | 15 |

TABLE 4

| | | Comparative Example Nos. | | | | |
|---|---|---|---|---|---|---|
| | | 6 | 7 | 8 | 9 | 10 |
| Thermosetting resin | (I) | 50 | 70 | 40 | 2 | 98 |
| containing | (II) | — | — | — | — | — |
| dihydrobenzoxazine rings | (III) | — | — | — | — | — |
| Novolac phenolic resin A | | 50 | — | 60 | 98 | 2 |
| Novolac phenolic resin B | | — | — | — | — | — |
| Hexamethylenetetramine | | — | — | — | — | — |
| Phenol | | — | 30 | — | — | — |

TABLE 5

| | Example Nos. | | | | |
|---|---|---|---|---|---|
| | 1 | 2 | 3 | 4 | 5 |
| Gel time (sec) | 92 | 80 | 58 | 45 | 90 |
| Cured product | | | | | |
| Appearance | Red and Clear | Red and Clear | Red and Clear | Red and Clear | Red and Clear |
| Surface | Smooth | Smooth | Smooth | Smooth | Smooth |
| Flexural strength (MPa) | 157.2 | 158.8 | 157.6 | 159.5 | 159.0 |
| Flexural modulus (MPa) | 5594 | 5650 | 5610 | 5620 | 5742 |
| Non-flammability | V-0 | V-0 | V-0 | V-0 | V-0 |

TABLE 6

| | Example Nos. | | | | |
|---|---|---|---|---|---|
| | 6 | 7 | 8 | 9 | 10 |
| Gel time (sec) | 95 | 70 | 132 | 120 | 142 |
| Cured product | | | | | |
| Appearance | Red and Clear | Red and Clear | Red and Clear | Red and Clear | Red and Clear |
| Surface | Smooth | Smooth | Smooth | Smooth | Smooth |
| Flexural strength (MPa) | 138.8 | 142.3 | 167.8 | 169.4 | 154.4 |
| Flexural modulus (MPa) | 4841 | 4560 | 5453 | 5662 | 5482 |
| Non-flammability | V-0 | V-0 | V-0 | V-0 | V-0 |

TABLE 7

| | Example Nos. | | |
|---|---|---|---|
| | 11 | 12 | 13 |
| Gel time (sec) | 115 | 96 | 82 |
| Cured product | | | |
| Appearance | Red and Clear | Red and Clear | Red and Clear |
| Surface | Smooth | Smooth | Smooth |
| Flexural strength (MPa) | 133.1 | 130.0 | 128.9 |
| Flexural modulus (MPa) | 4621 | 4000 | 4050 |
| Non-flammability | V-0 | V-0 | V-0 |

TABLE 8

| | Comparative Example Nos. | | | |
|---|---|---|---|---|
| | 1 | 2 | 3 | 4 |
| Gel time (sec) | 382 | 420 | 360 | 28 |
| Cured product | | | | |
| Appearance | Red and Clear | Red and Clear | Yellow orange and Clear | Brown and Opaque |
| Surface | Smooth | Smooth | Smooth | Many fine bubbles |
| Flexural strength (MPa) | 158.8 | 171.5 | 137.2 | 25.5 |
| Flexural modulus (MPa) | 5782 | 5684 | 4410 | 5120 |
| Non-flammability | V-0 | V-0 | V-0 | V-0 |

TABLE 9

| | Comparative Example Nos. | | | | |
|---|---|---|---|---|---|
| | 5 | 6 | 7 | 8 | 9 |
| Gel time (sec) | 80 | 37 | 60 | 45 | 185 |
| Cured product | | | | | |
| Appearance | Brown and Opaque | Red and Clear | Red and Clear | Red and Clear | Red and Clear |
| Surface | Many fine bubbles | Smooth | Smooth | Smooth | Smooth |
| Flexural strength (MPa) | 92.6 | 120.5 | 90.3 | 100.5 | 140.3 |
| Flexural modulus (MPa) | 464 | 5320 | 5400 | 5650 | 5451 |
| Non-flammability | V-0 | V-0 | V-0 | V-0 | V-0 |

TABLE 10

| | Comparative Example No. 10 |
|---|---|
| Gel time (sec) | 140 |
| Cured product | |
| Appearance | Red and Clear |
| Surface | Smooth |
| Flexural strength (MPa) | 152.5 |
| Flexural modulus (MPa) | 5603 |
| Non-flammability | V-0 |

As apparent from the results as shown in the above tables, the thermosetting resin compositions of the present invention are cured fast, and the cured products are excellent in mechanical properties and non-flammability. The thermosetting resin composition of the present invention, therefore, are useful as the materials of high functional molding materials, paint, coating materials, adhesives, sealing materials, laminates, FRP and carbon goods.

What is claimed is:

1. A thermosetting resin composition comprising 60 to 97% by weight of a thermosetting resin containing dihydrobenzoxazine rings and 3 to 40% by weight of a novolac phenolic resin.

2. The thermosetting resin composition of claim 1, wherein the novolac phenolic resin has an ortho rate of at least 50%.

3. The thermosetting resin composition of claim 1, wherein phenolic hydroxyl groups in the thermosetting resin composition and nitrogen atoms contained in the dihydrobenzoxazine rings are present in a number ratio of the phenolic hydroxyl groups/the nitrogen atoms of not more than 1.5.

4. The thermosetting resin composition of claim 1, wherein the thermosetting resin containing dihydrobenzoxazine rings is a reaction product of a compound which has at least two hydroxyphenylene groups each containing hydrogen at one or both ortho-positions to a hydroxyl group thereof, 0.5 to 1.0 moles of a primary amine per mole of phenolic hydroxyl groups of the compound, and at least two moles of formaldehyde per mole of the primary amine.

5. The thermosetting resin composition of claim 4, wherein the compound is a phenol novolac resin or bisphenol A.

6. A cured product of the thermosetting resin composition of claim 1.

7. A prepreg produced by impregnating a base material with a varnish containing the thermosetting resin composition of claim 1, followed by drying with heat.

8. The prepreg of claim 7, wherein the base material is a glass cloth, non-woven glass cloth, organic fiber cloth, non-woven organic fiber cloth or paper.

9. A metal-clad laminate comprising a laminate produced by bonding two or more sheets of the prepreg of claim 7 together using heat and pressure, and metal foil bonded to one or both surfaces of the laminate.

10. A wiring board comprising an insulating base and a conductor pattern formed inside or on one or both surfaces of the insulating base, the insulating base comprising a matrix of a cured product of the thermosetting resin composition of claim 1 and a base material reinforcing the matrix.

11. A thermosetting resin composition comprising 5 to 30% by weight of a thermosetting resin containing dihydrobenzoxazine rings and 70 to 95% by weight of a novolac phenolic resin.

12. The thermosetting resin composition of claim 11, wherein the novolac phenolic resin has an ortho rate of at least 50%.

13. The thermosetting resin composition of claim 11, wherein the thermosetting resin containing dihydrobenzoxazine rings is a reaction product of a compound which has at least two hydroxyphenylene groups each containing hydrogen at one or both ortho-positions to a hydroxyl group thereof, 0.5 to 1.0 moles of a primary amine per mole of phenolic hydroxyl groups of the compound, and at least two moles of formaldehyde per mole of the primary amine.

14. The thermosetting resin composition of claim 13, wherein the compound is a phenol novolac resin or bisphenol A.

15. A cured product of the thermosetting resin composition of claim 11.

16. A prepreg produced by impregnating a base material with a varnish containing the thermosetting resin composition of claim 11, followed by drying with heat.

17. The prepreg of claim 16, wherein the base material is a glass cloth, non-woven glass cloth, organic fiber cloth, non-woven organic fiber cloth or paper.

18. A metal-clad laminate comprising a laminate produced by bonding two or more sheets of the prepreg of claim 16 together using heat and pressure, and metal foil bonded to one or both surfaces of the laminate.

19. A wiring board comprising an insulating base and a conductor pattern formed inside or on one or both surfaces of the insulating base, the insulating base comprising a matrix of a cured product of the thermosetting resin composition of claim 11 and a base material reinforcing the matrix.

20. A thermosetting resin composition selected from the group consisting of (a) a first thermosetting resin composition comprising 60 to 97% by weight of at least one thermosetting resin containing dihydrobenzoxazine rings and 3 to 40% by weight of at least one novolac phenolic resin; and (b) a second thermosetting resin composition comprising 5 to 30% by weight of at least one thermosetting resin containing dihydrobenzoxazine rings and 70 to 95% by weight of at least one novolac phenolic resin.

\* \* \* \* \*